United States Patent
Suzuki et al.

(10) Patent No.: US 12,278,459 B2
(45) Date of Patent: Apr. 15, 2025

(54) DUMMY BAR CONFIGURED TO ALIGN LASER DIODE BAR DURING DEPOSITION OF FILM ON END FACES OF LASER DIODE BAR AND METHOD FOR DEPOSITING FILM ON END FACES OF LASER DIODE BAR

(71) Applicant: Mitsubishi Electric Corporation, Tokyo (JP)

(72) Inventors: Masato Suzuki, Tokyo (JP); Masatsugu Kusunoki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 26 days.

(21) Appl. No.: 18/001,458

(22) PCT Filed: Sep. 14, 2020

(86) PCT No.: PCT/JP2020/034717
§ 371 (c)(1),
(2) Date: Dec. 9, 2022

(87) PCT Pub. No.: WO2022/054281
PCT Pub. Date: Mar. 17, 2022

(65) Prior Publication Data
US 2023/0231360 A1     Jul. 20, 2023

(51) Int. Cl.
*C23C 14/50* (2006.01)
*B05C 1/02* (2006.01)
(Continued)

(52) U.S. Cl.
CPC ............... *H01S 5/028* (2013.01); *B05C 1/02* (2013.01); *C23C 14/50* (2013.01); *H01S 5/4025* (2013.01)

(58) Field of Classification Search
CPC ........ H01S 5/028; H01S 5/022; H01S 5/2315; C23C 14/50; C23C 14/04; C23C 14/042; C23C 16/04; C23C 16/042; C23C 16/50
(Continued)

(56) References Cited

U.S. PATENT DOCUMENTS

| | | | | |
|---|---|---|---|---|
| 5,911,830 A | * | 6/1999 | Chakrabarti | .......... C23C 14/505 118/503 |
| 6,037,006 A | * | 3/2000 | Chakrabarti | ............ C23C 14/50 118/503 |

(Continued)

FOREIGN PATENT DOCUMENTS

| | | |
|---|---|---|
| CN | 102646924 A | 8/2012 |
| JP | 2000-252580 A | 9/2000 |

(Continued)

OTHER PUBLICATIONS

An Office Action mailed by China National Intellectual Property Administration on Sep. 26, 2024, which corresponds to Chinese Patent Application No. 202080104305.0 and is related to U.S. Appl. No. 18/001,458; with English language translation.

(Continued)

*Primary Examiner* — Karl Kurple
(74) *Attorney, Agent, or Firm* — Studebaker Brackett PLLC

(57) ABSTRACT

A dummy bar is used to align a laser diode bar during deposition of an insulating film on a front end face (32) and a rear end face (34) of a laser diode bar (30), the dummy bar including a body part (12) having a plate shape, and including a pair of side surfaces (14), an upper surface (16), and a lower surface (18), the body part having a longitudinal length equal to a longitudinal length of the laser diode bar (30), the pair of side surfaces (14) being orthogonal to a longitudinal direction and opposite each other, the upper surface (16) and the lower surface (18) being orthogonal to (Continued)

the pair of side surfaces, parallel to a thickness direction of the plate shape, and opposite each other and a handle part (20) provided at a position separated from the lower surface (18) on each of the pair of side surfaces (14).

4 Claims, 5 Drawing Sheets

(51) Int. Cl.
*H01S 5/028* (2006.01)
*H01S 5/40* (2006.01)

(58) Field of Classification Search
USPC .................. 438/28, 22, 26, 33; 257/33.056
See application file for complete search history.

(56) References Cited

U.S. PATENT DOCUMENTS

| | | | | |
|---|---|---|---|---|
| 10,985,528 | B2 * | 4/2021 | Gerhard | ............. H01S 5/22 |
| 2004/0086645 | A1 * | 5/2004 | Valenti | ............. H01S 5/028 |
| | | | | 427/294 |
| 2012/0214265 | A1 * | 8/2012 | Onishi | ............. H01S 5/04256 |
| | | | | 257/E33.056 |
| 2023/0238772 | A1 * | 7/2023 | Suzuki | ............. H01S 5/4025 |
| | | | | 427/58 |
| 2023/0291180 | A1 * | 9/2023 | Sugiyama | ............. H01S 5/04252 |

FOREIGN PATENT DOCUMENTS

| | | |
|---|---|---|
| JP | 2001-077454 A | 3/2001 |
| JP | 2007-123374 A | 5/2007 |

OTHER PUBLICATIONS

International Search Report issued in PCT/JP2020/034717; mailed Nov. 2, 2020.

An Office Action; mailed by China National Intellectual Property Administration on Feb. 28, 2025, which corresponds to Chinese Patent Application No. 202080104305.0 and is related to U.S. Appl. No. 18/001,458; with English language translation.

* cited by examiner

DUMMY BAR CONFIGURED TO ALIGN LASER DIODE BAR DURING DEPOSITION OF FILM ON END FACES OF LASER DIODE BAR AND METHOD FOR DEPOSITING FILM ON END FACES OF LASER DIODE BAR

FIELD

The present disclosure relates to a dummy bar used to align a laser diode bar during deposition of an insulating film on end faces of the laser diode bar and to a method for depositing film on end faces of a laser diode bar by using the dummy bar.

BACKGROUND

A laser diode resonates light at a resonator between end faces and externally emits part of the light through the end faces. To resonate light, an insulating film having a controlled reflectance needs to be deposited on the end faces of the laser diode. The insulating film also protects the end faces of the laser diode.

When an insulating film is to be deposited on end faces of a laser diode, first, laser diode bars are produced by separating, by cleavage, a semiconductor substrate wafer on which a plurality of laser diode devices are formed in a lattice. Subsequently, as disclosed in PTL 1, dummy bars and the laser diode bars are alternately arranged and fixed on a plate having an opening. In this case, the arrangement is made such that a lower surface of each dummy bar and one of the end faces of each laser diode bar are aligned with each other and the one end face is adjacent to the opening. A longitudinal length of the dummy bar is longer than a longitudinal length of the laser diode bar. Thus, the dummy bar has excellent handleability in the above-described arrangement process. Subsequently, an insulating film is sequentially deposited on both end faces of each laser diode bar.

The above-described plate is contaminated by an insulating film material at end face film deposition and thus needs to be cleaned. Through the cleaning, the plate can be used a plurality of times.

CITATION LIST

Patent Literature

[PTL 1] JP 2007-123374 A

SUMMARY

Technical Problem

However, periphery of the opening is worn as the plate is cleaned. When the dummy bar and the laser diode bar are arranged on the plate at film deposition on an end face of a laser diode by using the plate thus worn, the laser diode bar having a longitudinal length shorter than that of the dummy bar sinks at a worn place on the plate. As a result, the dummy bar and the laser diode bar are displaced from each other. The displacement causes a problem of change in the amount of insulating-film straying from the end face of the laser diode bar at film deposition. The change of the insulating-film amount leads to decrease in reliability of an insulating film deposited on the end face of the laser diode bar.

The present disclosure is intended to solve the above-described problem and provide a dummy bar that has excellent handleability and with which the amount of insulating-film straying at film deposition on an end face of a laser diode bar can be highly accurately controlled even when a plate is worn. The present disclosure is also intended to provide a method for depositing film on end faces of a laser diode bar by using a dummy bar that has excellent handleability and with which the amount of insulating-film straying at film deposition on an end face can be highly accurately controlled even when a plate is worn.

Solution to Problem

A dummy bar according to the present disclosure is a dummy bar used to align a laser diode bar during deposition of an insulating film on a front end face and a rear end face of the laser diode bar, the dummy bar including a body part having a plate shape, and including a pair of side surfaces, an upper surface, and a lower surface, the body part having a longitudinal length equal to a longitudinal length of the laser diode bar, the pair of side surfaces being orthogonal to a longitudinal direction and opposite each other, the upper surface and the lower surface being orthogonal to the pair of side surfaces, parallel to a thickness direction of the plate shape, and opposite each other and a handle part provided at a position separated from the lower surface on each of the pair of side surfaces.

A method for depositing film on end faces of a laser diode bar according to the present disclosure, the method includes a step of alternately arranging the dummy bars and the laser diode bars on a plate having an opening such that the lower surface of each dummy bar is aligned with one end face of the front and rear end faces of each laser diode bar and the one end face is adjacent to the opening, a step of depositing an insulating film on another end face opposite the one end face and a step of depositing an insulating film on the one end face through the opening.

Advantageous Effects of Invention

According to a dummy bar and a method for depositing film on end faces of a laser diode bar in the present disclosure, the dummy bar has excellent handleability and the amount of insulating-film straying at film deposition on an end face of the laser diode bar can be highly accurately controlled even when a plate is worn.

DESCRIPTION OF EMBODIMENTS

First Embodiment

Figure 1:
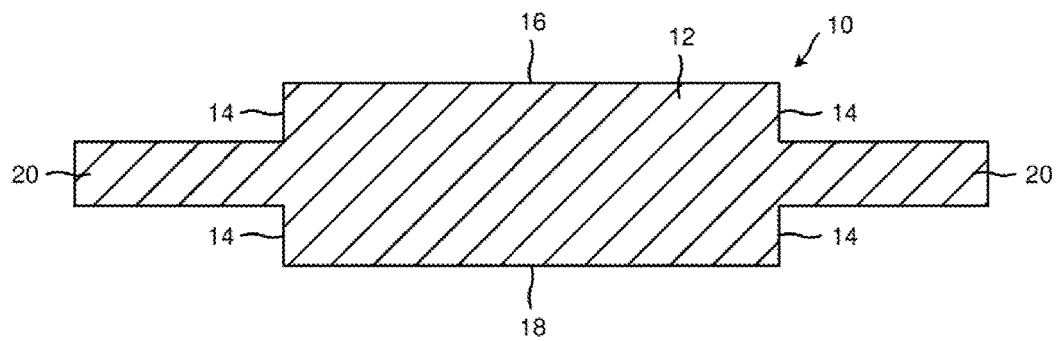
FIG. 1 is a diagram illustrating a dummy bar according to the first embodiment.
Figure 2:
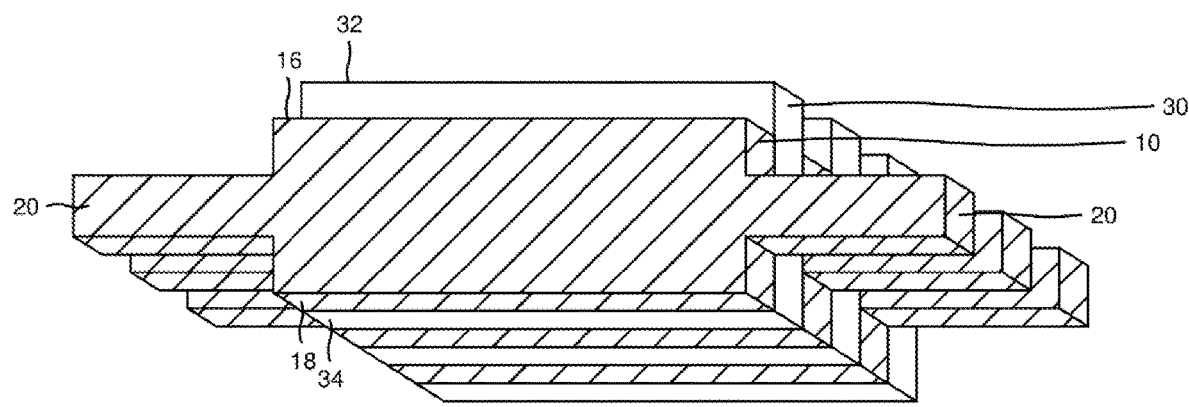
FIG. 2 is a diagram illustrating a state in which the dummy bars according to the first embodiment and laser diode bars are arranged.

The configuration of a dummy bar according to the first embodiment will be described below. A dummy bar 10 according to the present embodiment is illustrated in FIG. 1. The dummy bar 10 is made of, for example, stainless steel (SUS). FIG. 2 is a diagram illustrating a state in which the dummy bars 10 and laser diode bars 30 are alternately arranged. A laser diode bar is obtained by dividing, by cleavage, a semiconductor substrate wafer on which a plurality of laser diode devices are formed in a lattice.

Each dummy bar 10 includes a body part 12 and handle parts 20. The body part 12 has a plate shape, and includes a pair of side surfaces 14, an upper surface 16, and a lower surface 18, the pair of side surfaces 14 being orthogonal to a longitudinal direction and opposite each other, the upper surface 16 and the lower surface 18 being orthogonal to the pair of side surfaces 14, parallel to the thickness direction of the plate shape, and opposite each other. A longitudinal length of the body part 12 is equal to a longitudinal length of each laser diode bar 30. A length of the body part 12 from the upper surface 16 to the lower surface 18 is shorter than a length of the laser diode bar 30 from a front end face 32 to a rear end face 34. The handle parts 20 are each provided at a position separated from the lower surface 18 on respective one of the pair of side surfaces 14.

Subsequently, a method for depositing film on end faces of a laser diode bar by using the dummy bar 10 will be described below. Although not illustrated, resonators are formed alongside each other in a longitudinal direction of the laser diode bar 30 between the front end face 32 and the rear end face 34 of the laser diode bar 30. The front end face is a face through which a laser beam is emitted, and the rear end face is an end face opposite the front end face. An insulating film having a controlled reflectance needs to be formed on the front end face 32 and the rear end face 34 to resonate light at the resonators. A method for the film deposition will be described below.

Figure 3:
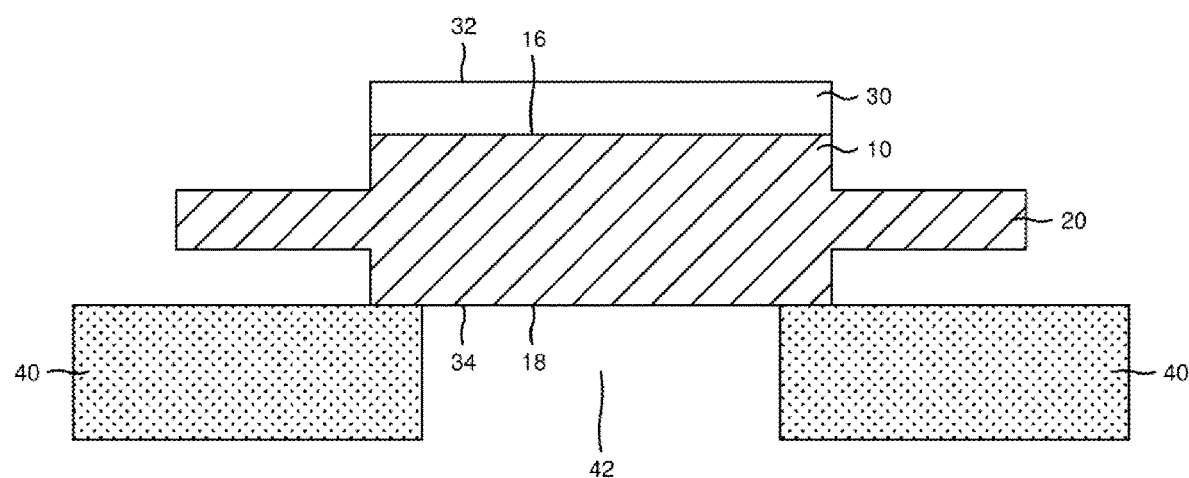
FIG. 3 is a diagram for explaining a method for depositing film on end faces of a laser diode bar according to the first embodiment.

First, the dummy bars 10 and the laser diode bars 30 are arranged on a plate 40 having an opening 42 as illustrated in FIG. 3. In this case, the dummy bars 10 and the laser diode bars 30 are alternately arranged. Each dummy bar 10 is provided between laser diode bars 30 to avoid close contact between the laser diode bars 30. FIG. 2 illustrates a state in which the dummy bars 10 and the laser diode bars 30 are alternately arranged. The arrangement is made such that the lower surface 18 of each dummy bar 10 is aligned with the rear end face 34 of each laser diode bar 30 and the rear end face 34 is adjacent to the opening 42. The dummy bar 10 has excellent handleability because a worker or a machine can grab the handle part 20 with a jig such as tweezers when arranging the dummy bars 10 and the laser diode bars 30 in the above-described manner.

Figure 4:
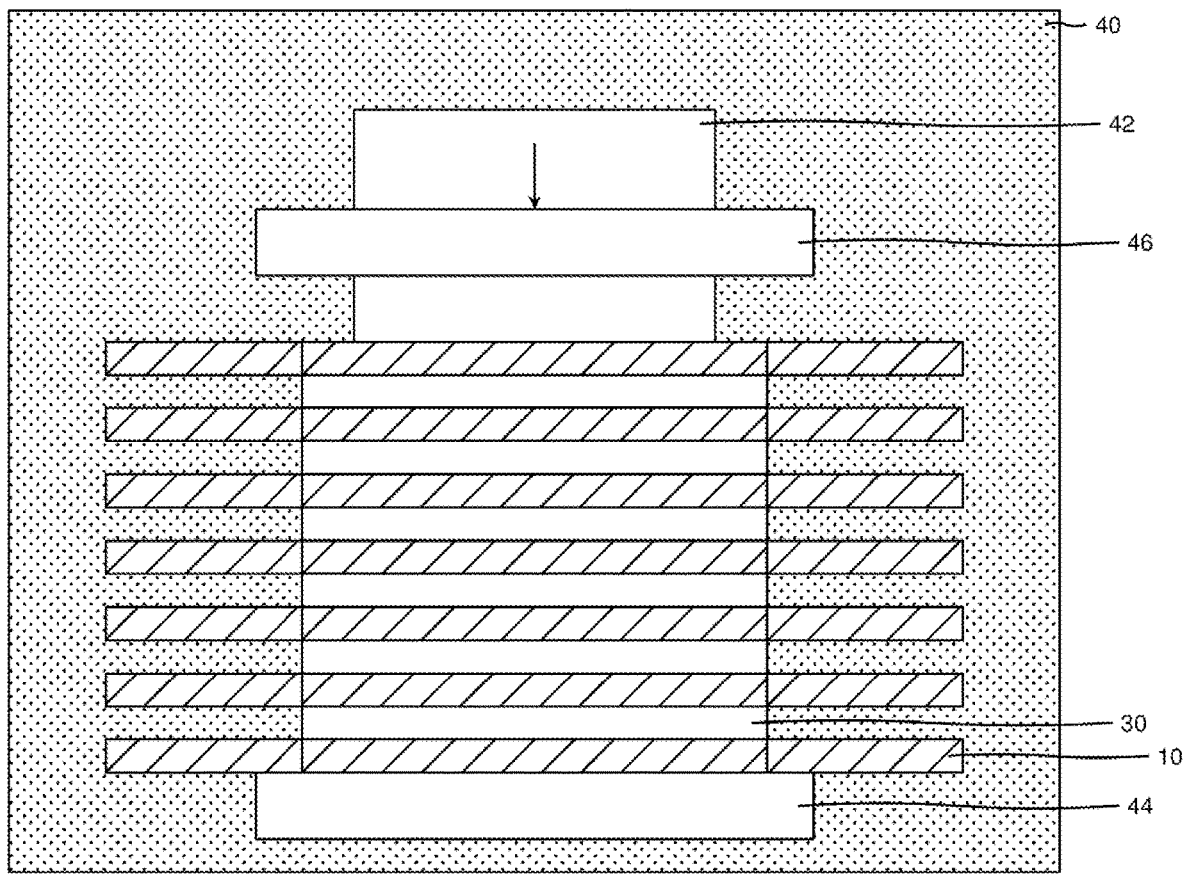
FIG. 4 is a diagram for explaining a method for depositing film on end faces of a laser diode bar according to the first embodiment.

Subsequently, the dummy bars 10 and the laser diode bars 30 are fixed to the plate 40. The fixation is not limited to a particular method but may be performed by, for example, pressing the dummy bars 10 and the laser diode bars 30 in the direction of the arrow toward a stopper 44 fixed to the plate 40 with a fixation jig 46 as illustrated in FIG. 4.

Figure 5:
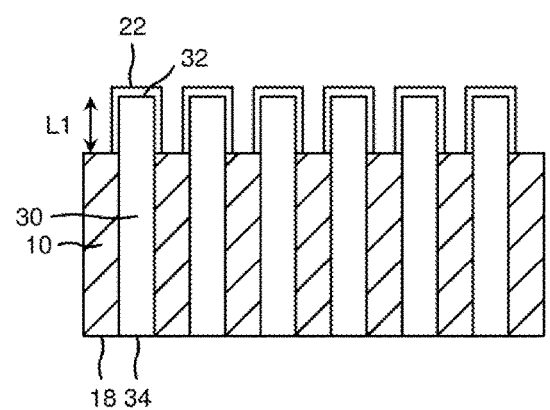
FIG. 5 is a diagram for explaining a method for depositing film on end faces of a laser diode bar according to the first embodiment.

Subsequently, an insulating film 22 is deposited on the front end face 32 of each laser diode bar 30 as illustrated in FIG. 5. A method such as vacuum vapor deposition, sputtering, or chemical vapor deposition (CVD) is used for the film deposition on the front end face 32. In this case, the formed insulating film 22 strays on side surfaces as well as the front end face 32. Typically, an end face (the front end face 32 or the rear end face 34) of each laser diode bar 30 needs to align with or protrude from an end face (the upper surface 16 or the lower surface 18) of each dummy bar 10 to align each laser diode bar such that deposition of the insulating film is well controlled as intended. Thus, the length between the front and rear end faces of each laser diode bar 30 needs to be equal to the length between the upper and lower surfaces of each dummy bar 10 or needs to be longer than the length between the upper and lower surfaces of each dummy bar 10 with dimension variation of the laser diode bars 30 and the dummy bars 10 taken into account. In the present embodiment, the length between the front and rear end faces of each laser diode bar 30 is shorter than the length between the upper and lower surfaces of each dummy bar 10. Accordingly, the insulating film 22 on the front end face 32 side is formed on the side surfaces as well, which provides an effect of increasing reliability of the insulating film 22 on the front end face 32. The formation of the insulating film 22 on the side surfaces as described above is effective, for example, when higher reliability is requested for the front end face 32 through which a laser beam is emitted than for the rear end face 34. However, increase of the amount of straying of the insulating film 22 causes a problem of heat-releasing performance decrease of laser diode chips when mounted on a sub-mount after separation into the laser diode chips. Thus, the amount of insulating-film straying needs to be highly accurately controlled.

The amount of straying of the insulating film 22 from the front end face 32 to the side surfaces is highly accurately controlled. This is because a length L1 of straying of the insulating film 22 from the front end face 32 is constant since the lower surface 18 of each dummy bar 10 and the rear end face 34 of each laser diode bar 30 are aligned with each other. The length L1 is illustrated in FIG. 5.

Subsequently, the plate 40 to which the dummy bars 10 and the laser diode bars 30 are fixed is vertically inverted, and an insulating film is deposited on the rear end face 34 of each laser diode bar 30 through the opening 42. However, the vertical inversion is unnecessary in some cases, depending on positioning of a film deposition device or the like. A method used for the film deposition on the rear end face 34 is the same as the method used for the film deposition on the front end face 32. The rear end face 34 is basically a surface through which a laser beam is not emitted. Only low-output light is emitted for monitoring even when a laser beam is emitted. Thus, requested reliability of an insulating film is not as high as that for the front end face 32 in some cases, and insulating-film straying does not necessarily need to occur in such a case. Increase of the amount of insulating-film straying causes a problem of heat-releasing performance decrease of laser diode chips when mounted on a sub-mount after separation into the laser diode chips.

No insulating film strays from the rear end face 34 and is deposited on the side surfaces. This is because the lower surface 18 of each dummy bar 10 and the rear end face 34 of each laser diode bar 30 are aligned with each other.

Figure 6:
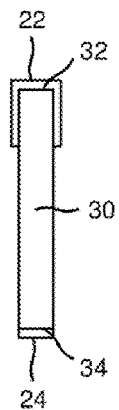
FIG. 6 is a diagram for explaining a method for depositing film on end faces of a laser diode bar according to the first embodiment.

Accordingly, film deposition on end faces of each laser diode bar 30 is completed, and the laser diode bar with the insulating film 22 deposited on the front end face 32 and with an insulating film 24 deposited on the rear end face 34 as illustrated in FIG. 6 is obtained.

Subsequently, wear of the plate 40 will be described below.

The plate 40 is contaminated by an insulating film material at end face film deposition on each laser diode bar 30. Thus, the plate 40 is cleaned to remove any adhering insulating film material. Through the cleaning, the plate 40 can be used a plurality of times. A mechanical method or a chemical method is used for the cleaning.

Figure 7:
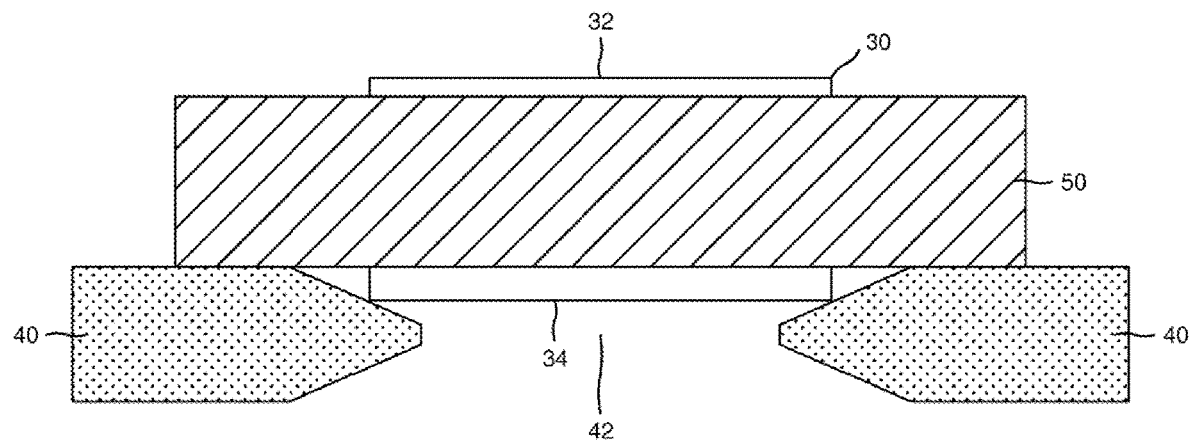
FIG. 7 is a diagram illustrating a state in which a conventional dummy bar and a laser diode bar are arranged on a worn plate.

However, the cleaning of the plate 40 wears periphery of the opening 42. When a conventional dummy bar 50 and a laser diode bar 30 are arranged on the plate 40 thus worn, the laser diode bar 30 sinks relative to the conventional dummy bar 50 at a worn place as illustrated in FIG. 7. The conventional dummy bar 50 is a dummy bar formed in a rectangular parallelepiped shape with a longitudinal length longer than that of the laser diode bar 30.

When the laser diode bar 30 sinks, the conventional dummy bar 50 and the laser diode bar 30 are displaced relative to each other. The displacement changes the amount of straying of an insulating film from an end face at film deposition, which causes a problem of reliability decrease of the insulating film. Furthermore, increase of the amount of insulating-film straying causes a problem of heat-releasing performance decrease of laser diode chips.

Figure 8:
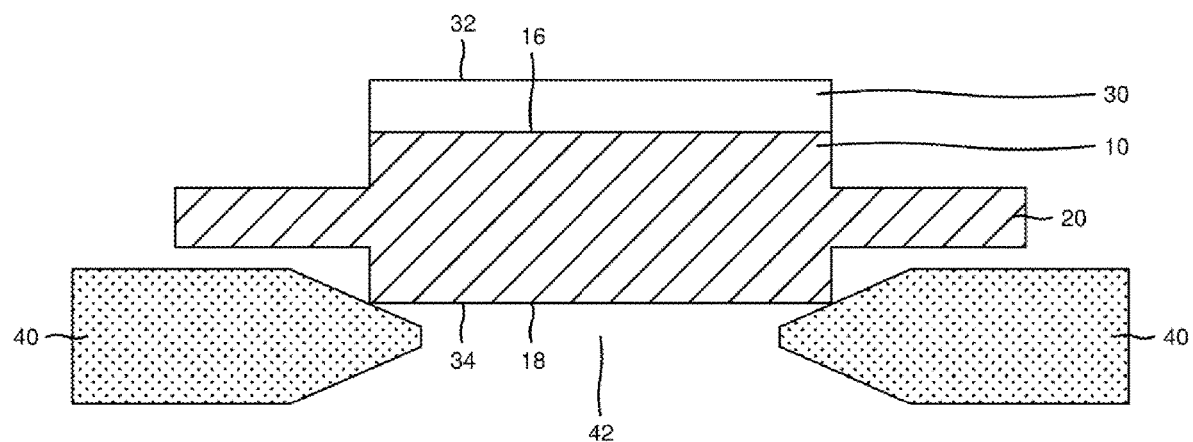
FIG. 8 is a diagram illustrating a state in which the dummy bar according to the first embodiment and the laser diode bar are arranged on the worn plate.

In contrast, in each dummy bar 10 according to the present embodiment, the longitudinal length of the body part 12 is equal to the longitudinal length of each laser diode bar 30, and the handle parts 20 are each provided at a position separated from the lower surface 18 on respective one of the pair of side surfaces 14. Thus, the dummy bar 10 and the laser diode bar 30 equally sink when the plate 40 is worn as illustrated in FIG. 8, and thus the dummy bar 10 and the laser diode bar 30 are not displaced from each other. As a result, the amount of insulating-film straying at film deposition on an end face of the laser diode bar 30 is highly accurately controlled even when the plate 40 is worn.

As described above, according to the present embodiment, since each dummy bar 10 includes the handle parts 20, the dummy bar 10 has excellent handleability. Moreover, since the longitudinal length of the body part 12 of the dummy bar 10 is equal to the longitudinal length of each laser diode bar 30 and the handle parts 20 are each provided at a position separated from the lower surface 18 on respective one of the pair of side surfaces 14, the amount of insulating-film straying at film deposition on an end face of the laser diode bar 30 can be highly accurately controlled even when the plate 40 is worn.

Since the length of the body part 12 of the dummy bar 10 from the upper surface 16 to the lower surface 18 is shorter than the length of the laser diode bar 30 from the front end face 32 to the rear end face 34, the insulating film 22 is deposited on side surfaces as well when the insulating film is deposited on the front end face 32, and thus reliability of the insulating film 22 formed on the front end face 32 increases.

Since the lower surface 18 of the dummy bar 10 and the rear end face 34 of the laser diode bar 30 are aligned with each other when the dummy bar 10 and the laser diode bar 30 are arranged on the plate 40, an insulating film deposited on the rear end face 34 does not stray on side surfaces.

Note that higher reliability is required for the front end face 32 of the laser diode bar 30 than for the rear end face 34 in some cases, and in other cases, higher reliability is required for the rear end face 34 than for the front end face 32 or equivalent higher reliability is required for the front end face 32 and the rear end face 34. Thus, the length of the body part 12 from the upper surface 16 to the lower surface 18 may be equal to the length of the laser diode bar 30 from the front end face 32 to the rear end face 34. Moreover, when the dummy bar 10 and the laser diode bar 30 are arranged, not the rear end face 34 but the front end face 32 may be aligned with the lower surface 18 of the dummy bar 10. Specifically, the lower surface 18 is aligned with one end face of the front end face 32 and the rear end face 34, an insulating film is deposited on the other end face opposite the one end face, and an insulating film is deposited on the one end face through the opening 42.

The order of film deposition on the front end face 32 and the rear end face 34 does not necessarily need to start with the rear end face 34 but may start with the front end face 32.

Second Embodiment

Figure 9:
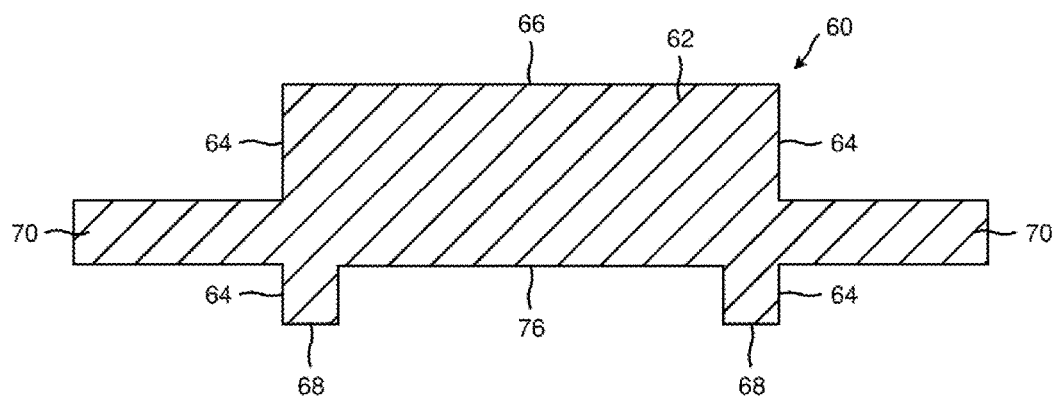
FIG. 9 is a diagram illustrating a dummy bar according to the second embodiment.
Figure 10:
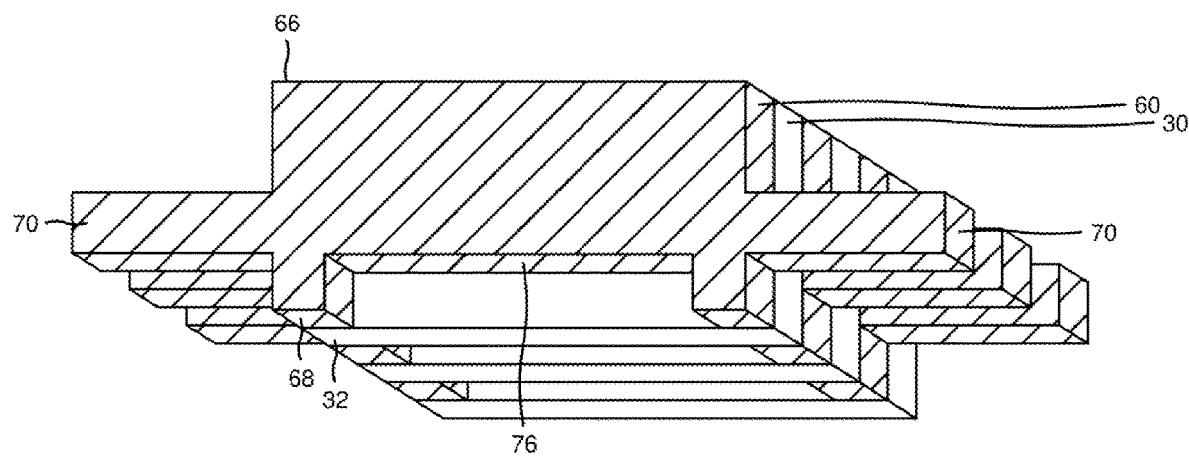
FIG. 10 is a diagram illustrating a state in which the dummy bars according to the second embodiment and the laser diode bars are arranged.

The configuration of a dummy bar according to the second embodiment will be described below. A dummy bar 60 according to the present embodiment is illustrated in FIG. 9. FIG. 10 is a diagram illustrating a state in which the dummy bars 60 and laser diode bars 30 are alternately arranged.

Each dummy bar 60 includes a body part 62 and handle parts 70. A length of the body part 62 from an upper surface 66 to a lower surface 68 is equal to the length of each laser diode bar 30 from the front end face 32 to the rear end face 34. The body part 62 includes a recessed part 76 at the lower surface 68. The recessed part 76 has a U shape when viewed in a thickness direction of a plate shape. The handle parts 70 are each provided at a position separated from the lower surface 68 on respective one of a pair of side surfaces 64. The dummy bar 60 is the same as the dummy bar 10 of the first embodiment except for the length from the upper surface 66 to the lower surface 68 and the recessed part 76.

Subsequently, a method for depositing film on end faces of a laser diode bar by using the dummy bar 60 will be described below.

Figure 11:
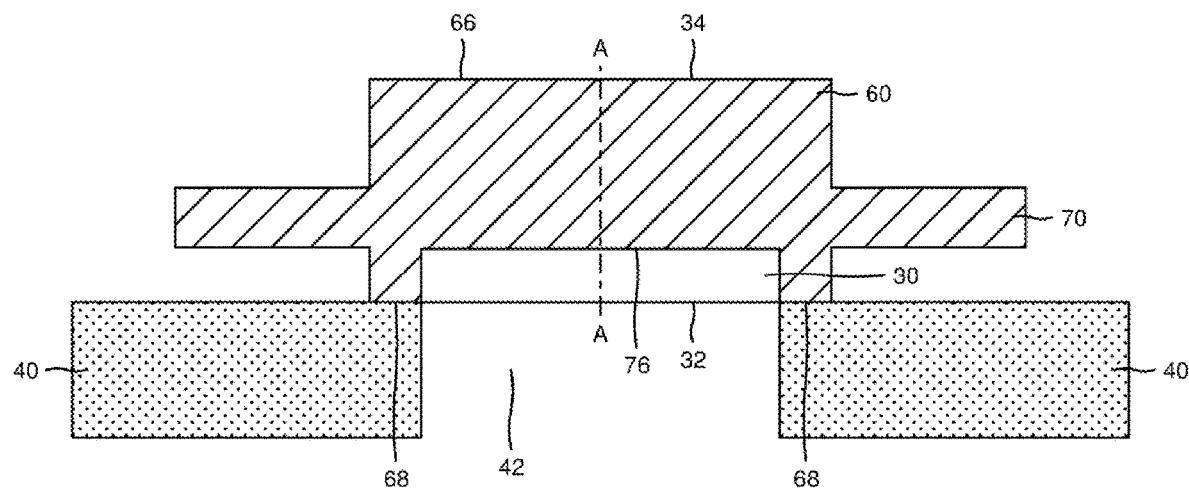
FIG. 11 is a diagram for explaining a method for depositing film on end faces of a laser diode bar according to the second embodiment.

First, the dummy bars 60 and the laser diode bars 30 are arranged on the plate 40 having the opening 42 as illustrated in FIG. 11. In this case, the dummy bars 60 and the laser diode bars 30 are alternately arranged. FIG. 10 illustrates a state in which the dummy bars 60 and the laser diode bars 30 are alternately arranged. The arrangement is made such that the lower surface 68 of each dummy bar 60 and the front end face 32 of each laser diode bar 30 are aligned with each other and the front end face 32 is adjacent to the opening 42.

Subsequently, similarly to the first embodiment, the dummy bars 60 and the laser diode bars 30 are fixed to the plate 40.

Subsequently, an insulating film is deposited on the rear end face 34 of each laser diode bar 30. In this case, the formed insulating film does not stray from the rear end face 34 onto side surfaces. This is because the lower surface 68 of each dummy bar 60 and the front end face 32 of each laser diode bar 30 are aligned with each other and the length from the upper surface 66 to the lower surface 68 is equal to the length of the laser diode bar 30 from the front end face 32 to the rear end face 34.

Figure 12:
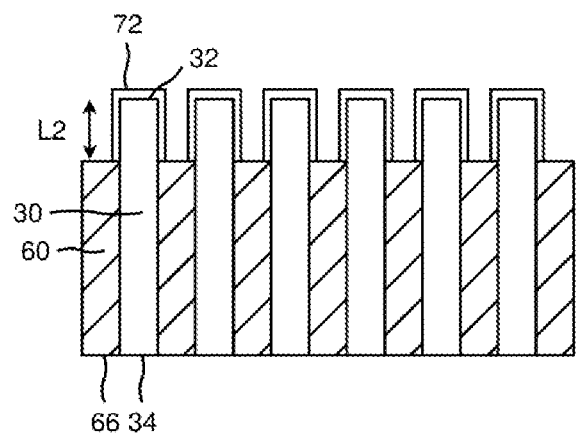
FIG. 12 is a diagram for explaining a method for depositing film on end faces of a laser diode bar according to the second embodiment.

Subsequently, the plate 40 to which the dummy bars 60 and the laser diode bars 30 are fixed is vertically inverted, and an insulating film 72 is deposited on the front end face 32 of each laser diode bar 30 through the opening 42. However, the vertical inversion is unnecessary in some cases, depending on positioning of a film deposition device or the like. FIG. 12 is a section diagram along A-A in FIG. 11 after the insulating film 72 is deposited on the front end face 32. However, the vertical direction is opposite that of FIG. 11. The insulating film 72 is deposited on the front end face 32 of each laser diode bar 30 as illustrated FIG. 12. In this case, since each dummy bar 60 includes the recessed part 76, the formed insulating film 72 strays on not only the front end face 32 but also side surfaces.

The amount of straying of the insulating film 72 from the front end face 32 to side surfaces is highly accurately controlled. This is because a length L2 of insulating-film straying from the front end face 32 is constant since the lower surface 68 of each dummy bar 60 and the front end face 32 of each laser diode bar 30 are aligned with each other. The length L2 is illustrated in FIG. 12.

Figure 13:
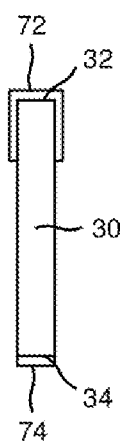
FIG. 13 is a diagram for explaining a method for depositing film on end faces of a laser diode bar according to the second embodiment.

Accordingly, film deposition on end faces of each laser diode bar 30 is completed, and the laser diode bar with the insulating film 72 deposited on the front end face 32 and with an insulating film 74 deposited on the rear end face 34 as illustrated in FIG. 13 is obtained.

As described above, according to the present embodiment, since each dummy bar 60 includes the handle parts 70, the dummy bar 60 has excellent handleability. Moreover, since the longitudinal length of the body part 62 of the dummy bar 60 is equal to the longitudinal length of each laser diode bar 30 and the handle parts 70 are each provided at a position separated from the lower surface 68 on respective one of the pair of side surfaces 64, the amount of insulating-film straying at film deposition on an end face of the laser diode bar 30 can be highly accurately controlled even when the plate 40 is worn.

Additionally, since the dummy bar 60 includes the recessed part 76, the insulating film 72 is deposited on side surfaces as well when the insulating film is deposited on the front end face 32 as illustrated in FIG. 11, and thus reliability of the insulating film 72 deposited on the front end face 32 increases.

Since the lower surface 68 of the dummy bar 60 and the front end face 32 of the laser diode bar 30 are aligned with each other and the length from the upper surface 66 to the lower surface 68 is equal to the length of the laser diode bar 30 from the front end face 32 to the rear end face 34, an insulating film deposited on the rear end face 34 does not stray on side surfaces.

Even when a resonator length of the laser diode bar 30 has fluctuations, the amount of straying of the insulating film 72 on side surfaces on the front end face 32 side is constant irrespective of the fluctuations since the lower surface 68 of the dummy bar 60 and the front end face 32 of the laser diode bar 30 are aligned with each other.

Note that, similarly to description in the first embodiment, the length from the upper surface 66 to the lower surface 68 may be shorter than the length of the laser diode bar 30 from the front end face 32 to the rear end face 34. In this case, the insulating film 74 deposited on the rear end face 34 strays on side surfaces but the amount of straying is controlled. When the dummy bar 60 and the laser diode bar 30 are arranged, not the front end face 32 but the rear end face 34 may be aligned with the lower surface 68 of the dummy bar 60. Specifically, the lower surface 68 is aligned with one end face of the front end face 32 and the rear end face 34, an insulating film is deposited on the other end face opposite the one end face, and an insulating film is deposited on the one end face through the opening 42.

The order of film deposition on the front end face 32 and the rear end face 34 does not necessarily need to start with the front end face 32 but may start with the rear end face 34.

REFERENCE SIGNS LIST 10, 60 dummy bar
12, 62 body part
14, 64 pair of side surfaces
16, 66 upper surface
18, 68 lower surface
20, 70 handle part
22, 72 insulating film
24, 74 insulating film
76 recessed part
30 laser diode bar
32 front end face
34 rear end face
40 plate
42 opening
44 stopper
46 fixation jig
50 conventional dummy bar

The invention claimed is:

1. A dummy bar configured to align a laser diode bar during deposition of an insulating film on a front end face and a rear end face of the laser diode bar, the dummy bar comprising:
   a body part having a plate shape, and including a pair of side surfaces, an upper surface, and a lower surface, the body part having a longitudinal length equal to a longitudinal length of the laser diode bar, the pair of side surfaces being located at opposite surfaces of the body part in a first direction, the pair of side surfaces being orthogonal to a longitudinal direction, the upper surface and the lower surface being located at opposite surfaces of the body part in a second direction orthogonal to the first direction, the upper surface and the lower surface being orthogonal to the pair of side surfaces, the upper surface and the lower surface being parallel to a thickness direction of the plate shape; and
   a handle part provided at a position separated from the lower surface,
   wherein each of the pair of side surfaces includes a first surface above the handle part and a second surface below the handle part, and the handle part protrudes in the longitudinal direction from each of the pair of side surfaces at a position between the first surface and the second surface.

2. The dummy bar according to claim 1, wherein a length from the upper surface to the lower surface is a shorter than a length from the front end face to the rear end face.

3. The dummy bar according to claim 1, wherein a recessed part having a U shape when viewed in the thickness direction of the plate shape is provided at the lower surface of the body part.

4. The dummy bar according to claim 3, wherein a length of the dummy bar from the upper surface to the lower surface in the second direction is equal to a length of the laser diode bar from the front end face to the rear end face in the second direction.

* * * * *